United States Patent
Mitsumoto

(10) Patent No.: US 6,593,054 B2
(45) Date of Patent: Jul. 15, 2003

(54) PRESENSITIZED PLATE USEFUL FOR PREPARING A LITHOGRAPHIC PRINTING PLATE

(75) Inventor: Tomoyoshi Mitsumoto, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 138 days.

(21) Appl. No.: 09/791,740

(22) Filed: Feb. 26, 2001

(65) Prior Publication Data

US 2002/0064726 A1 May 30, 2002

(30) Foreign Application Priority Data

Mar. 6, 2000 (JP) ........................................ 2000-059797

(51) Int. Cl.$^7$ ............................................... G03F 7/021
(52) U.S. Cl. ...................... 430/156; 430/159; 430/161; 430/302; 430/270.1
(58) Field of Search ................................ 430/156, 160, 430/159, 302, 161, 158, 270.1

(56) References Cited

U.S. PATENT DOCUMENTS 4,588,669 A  *  5/1986  Asano ........................ 430/145
4,956,261 A      9/1990  Pawlowski et al.
5,476,754 A  * 12/1995  Imai et al. .................. 430/302

FOREIGN PATENT DOCUMENTS

EP          0443742 A2    8/1991

* cited by examiner

*Primary Examiner*—John S. Chu
(74) *Attorney, Agent, or Firm*—Burns, Doane, Swecker & Mathis, LLP

(57) ABSTRACT

The present invention provides a negative-working presensitized plate useful for preparing a lithographic printing plate having a negative-working photosensitive layer on an aluminum substrate, which comprises an intermediate layer comprising a compound having at least one diazonium group and molecular weight of 1000 or less formed between said photosensitive layer and said aluminum substrate. The lithographic printing plate prepared from the negative-working presensitized plate of the present invention shows excellent adhesiveness between a substrate and a photosensitive layer and does not cause contamination in non-imaging areas during printing operation, while maintaining high sensitivity, sensitive range and performance of the photosensitive layer.

8 Claims, No Drawings

PRESENSITIZED PLATE USEFUL FOR PREPARING A LITHOGRAPHIC PRINTING PLATE

BACKGROUND OF THE INVENTION

The present invention relates to a negative-working presensitized plate useful for preparing a lithographic printing plate and more specifically to that comprising diazo resin, photo-polymerizable resin, or photo-crosslinkable resin.

A photosensitive layer comprising diazo resin, photo-polymerizable resin, or photo-crosslinkable resin is known as a negative-working photosensitive layer in a presensitized plate usable for preparing a lithographic printing plate.

Examples of such photosensitive layer comprising diazo resin include a photosensitive layer comprising a binder polymer and diazo resin such as a reaction product of diazonium salt with organic condensation reagent comprising reactive carbonyl salt such as aldol and acetal, e.g., condensation product of diphenylamine-p-diazonium salt and formaldehyde, as described in U.S. Pat. Nos. 2,063,631 and 2,667,415.

Examples of photo-polymerizable composition include a basic composition comprised of a polymer as a binder, a monomer and initiator for photopolymerization as described in Japanese Patent Publication for Opposition Purpose (hereinafter referred to as "J.P.KOKOKU") No. 46-32174, a composition comprising a binder polymer in which unsaturated double bond has been introduced to improve efficiency of hardening of the binder as described in J.P.KOKOKU No. 49-34041, and a composition comprising a novel initiator for photopolymerization as described in J.P.KOKOKU No. 48-38403, J.P.KOKOKU No. 53-27605 and British Patent No.1388492.

In addition, polymers capable of crosslinking through cycloaddition reaction are well known as the photo-crosslinkable composition. As such photo-crosslinkable polymers, useful are polymers carrying maleimide group on the side chain, or polymers carrying a photo-dimerizable group having unsaturated double bond adjacent to aromatic ring such as cinnamyl group, cinnamoyl group, cinnamylidene group, and cinnamylideneacetyl group on the side chain or main chain. Especially, polymers having maleimide group on the side chain and polyesters having cinnamic acid skeleton in the molecule prepared by condensation of phenylenediacrylic acid or alkyl ester thereof with glycol are highly sensitive and some of them have already been practically used.

However, adhesiveness of such negative-working photosensitive layer to aluminum substrate is not sufficient. As a result, images are easily peeled off from the substrate or damaged when the plate is rubbed with a brush during development, and thus, the strength of image is not sufficient. Especially, in case of low exposure, this tendency becomes dominant and as a result, sensitivity of the photosensitive layer is decreased. In order to improve the low adhesiveness of the image to a substrate, many attempts have been made. For example, for a system in which photo-polymerizable composition is used, Japanese Unexamined Patent Publication (hereinafter referred to as "J.P. KOKAI") No. 54-72104 and U.S. Pat. No. 3,905,815 disclose that negative-working diazo resin is used as an undercoat layer, J.P. KOKAI No. 61-38943, J.P. KOKAI No. 2-111948, J.P. KOKAI No. 1-137890 disclose that diazo resin is incorporated into photosensitive composition. For a system in which photo-crosslinkable composition is used, J.P.KOKOKU No. 50-7481, J.P. KOKAI No. 62-78544, Japanese Patent Application (hereinafter referred to as "J.P.A.") No. 1-137891, and J.P.A. No. 2-37786 disclose use of diazo resins.

However, when the above diazo resin is used in an undercoat (intermediate) layer of photosensitive layer comprising diazo resin, photo-polymerizable resin or photo-crosslinkable resin, background contamination is seen in non-imaging areas. This problem is due to decomposition of diazonium group which chronologically decomposes to become adherent to the substrate that cannot be removed by developer. Thus, when a compound having many diazonium groups in its molecule is used as an intermediate layer, contamination during printing operation would be increased in accordance with the increase of the total number of diazonium groups.

SUMMARY OF THE INVENTION

An object of the present invention is to provide a negative-working presensitized plate useful for preparing a lithographic printing plate which has excellent adhesiveness between a substrate and a photosensitive layer and does not cause contamination in non-imaging areas during printing operation, while maintaining high sensitivity, sensitive range and performance of the photosensitive layer.

It is found that the above object is achieved by a negative-working presensitized plate useful for preparing a lithographic printing plate having a negative-working photosensitive layer on an aluminum substrate, which comprises an intermediate layer comprising a compound having at least one diazonium group and molecular weight of 1000 or less formed between said photosensitive layer and said aluminum substrate.

That is, although an intermediate layer comprising diazo resin is conventionally used in a negative-working presensitized plate having a negative-working photosensitive layer comprising diazo resin, photo-crosslinkable resin or photo polymerization resin on an aluminum substrate, the inventors of the present invention found that when a diazonium compound having at least one diazonium group and molecular weight of 1000 or less is used in place of conventional diazo resin in the intermediate layer, background contamination of non-imaging area does not occur and the adhesiveness between the photosensitive layer and the substrate is increased.

DESCRIPTION OF THE PREFERRED EMBODIMENTS

Intermediate Layer

Hereinafter, the intermediate layer usable in the presensitized plate that is useful for preparing a lithographic printing plate of the present invention will be described. The intermediate layer comprising diazonium compound of the present invention can be formed by applying a solution comprising diazonium compounds dissolved in a solvent onto after-mentioned aluminum substrate which is optionally treated to obtain hydrophilicity or grained.

The diazonium compound in the intermediate layer of the present invention includes a compound comprising at least one diazonium group in a molecule and having molecular weight of about 1000 or less. The diazonium compound comprising at least one diazonium group can be used in the present invention. But polyfunctional diazonium compound comprising plural diazonium groups can also be used. The diazonium compound of the present invention preferably comprises one or two diazonium groups and more preferably, one diazonium group.

In the present invention, preferable compound comprising one diazonium group includes, for example, compounds represented by the following general formula (I).

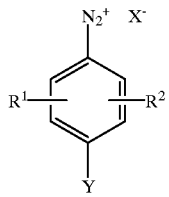
(I)

wherein, $R^1$ and $R^2$, which may be the same or different, are hydrogen atom, $C_{1-10}$ alkyl, $C_{1-10}$ alkoxy or halogen atom. More specifically, $R^1$ and $R^2$ each represents hydrogen atom, methyl, ethyl, propyl, butyl, methoxy, ethoxy, i-propyloxy, n-propyloxy, n-butyloxy, i-butyloxy, t-butyloxy, Cl, F, Br, I or the like; and Y represents —$NR^3R^4$ or —$SR^5$. $R^3$ and $R^4$, which may be the same or different, are hydrogen atom, hydroxy, $C_{1-10}$alkyl, aryl or 5- or 6-membered aliphatic or aromatic heterocyclic ring. Alternatively, nitrogen atom, $R_3$ and $R^4$ may be linked together to form a 5- or 6-membered aliphatic or aromatic heterocyclic ring. The above groups, (i.e., $C_{1-10}$alkyl, aryl and 5- or 6-membered aliphatic or aromatic heterocyclic ring) may have at least one substitutent selected from the group consisting of hydroxy, $C_{1-10}$alkyl, $C_{1-10}$alkoxy, $C_{1-10}$alkylcarbonyl, aryl, aryloxy, arylcarbonyl, and 5- or 6-membered aliphatic or aromatic heterocyclic ring.

The "aryl" group includes alkylaryl, arylalkyl and alkylarylalkyl.

Further, $R^3$ and $R^4$ may represent —$R^6G$. $R^6$ represents $C_{1-10}$alkylene, arylene, or bivalent group comprising $C_{1-10}$alkylene bonded to arylene. G represents at least one of —OR, —CO—R, —CO—NRR', —NRR', —NR—CO—R', wherein, R and R' may be the same or different and is hydrogen atom, hydroxy (excepting when G is —OR), $C_{1-10}$alkyl, $C_{1-10}$alkoxy, aryl, aryloxy (excepting when G is —OR), or 5- or 6-membered aliphatic or aromatic heterocyclic ring. Also, each of R and R' may have at least one substitutent selected from the group consisting of hydroxy, $C_{1-10}$alkyl, $C_{1-10}$alkoxy, aryl, aryloxy, and 5- or 6-membered aliphatic or aromatic heterocyclic ring, respectively.

More specifically, $R_3$ and $R^4$ each represents hydrogen atom, methyl, ethyl, propyl, butyl, hydroxymethyl, hydroxyethyl, hydroxypropyl, phenyl, benzyl, pyrrolidino, morpholino, pyridyl group and the like.

When —$NR^3R^4$ is 5- or 6-membered aliphatic or aromatic heterocyclic ring, examples of such heterocyclic ring include substituted or unsubstituted pyrrolidino, morpholino, pyridyl group and the like.

$R^5$ represents hydrogen atom, alkyl, alkoxyalkyl, arylalkyl, aryl, alkylaryl, alkoxyaryl and the like. More specifically, $R^5$ may represent hydrogen atom, methyl, ethyl, propyl, butyl, methoxymethyl, ethoxymethyl, phenyl, benzyl, p-tolyl group or the like.

$X^-$ represents $HSO_4^-$, $½SO_4^{2-}$, $BF_4^-$, $PF_6^-$, or anion of triisopropyl-naphthalenesulfonic acid, 5-nitro-orthotoluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy5-benzoyl-benzenesulfonic acid, paratoluenesulfonic acid, zinc chloride double salt or the like.

Among the compounds represented by Formula (I), preferable examples of cation of diazonium compound include cation of 4-diazodiphenylamine, 1-diazo-4-N,N-dimethylaminobenzene, 1-diazo-4-N, N-diethylaminobenzene, 1-diazo-4-N-ethyl-N-hydroxyethylaminobenzene, 1-diazo-4-N-methyl-N-hydroxyethylaminobenzene, 1-diazo-2, 5-diethoxy-4-benzoylaminobenzene, 1-diazo-4-N-benzylaminobenzene, 1-diazo-4-N-N-dimethylaminobenzene, 1-diazo-4-morpholinobenzene, 1-diazo-2 , 5-dimethoxy-4-p-tolylmercaptobenzene, 1-diazo-2-ethoxy-4-N, N-dimethylaminobenzene, p-diazo-dimethylaniline, 1-diazo-2 , 5-dibutyloxy-4-morpholinobenzene, 1-diazo-2 ,5-diethoxy-4-morpholinobenzene, 1-diazo-2 ,5-dimethoxy-4-morpholinobenzene, 1-diazo-2 ,5-diethoxy-4-p-tolylmercaptobenze 1-diazo-3-ethoxy-4-N-methyl-N-benzylaminobenzene, 1-diazo-3-chloro-4-N , N-diethylaminobenzene, 1-diazo-3-methyl-4-pyrrolidinobenzene, 1-diazo-2-chloro-4-N ,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propyloxy)-4-diazodiphenylamine, or 3-isopropyloxy-4-diazodiphenylamine.

As the diazonium compound in the intermediate layer of the present invention, a compound comprising plural diazonium groups and having molecular weight of 1000 or less can be also used.

Example of such compound comprising plural diazonium groups in a molecule includes tetrazonium sulfonate compound as disclosed in J.P.KOKOKU No. 44-23041.

The intermediate layer of the present invention may comprise, in addition to the diazonium compound described above, a sensitizer, a stabilizing agent for diazo group, a binder polymer, an antihalation agent, a surfactant or other known additives usable for intermediate layer, if necessary. The intermediate layer may comprise the diazonium compound described above in an amount ranging from 30 to 100% by weight, preferably from 50 to 100% by weight and more preferably from 70 to 100% by weight, on the basis of the total weight of the intermediate layer.

The diazonium compound described above may be dissolved in a suitable solvent and applied on an aluminum substrate by conventional means known in the art to obtain the intermediate layer.

Dry weight of the intermediate layer may be in the range of 1 to 50 mg/m$^2$, more preferably of 5 to 20 mg/m$^2$.

Photosensitive layer

As the negative-working photosensitive layer of the presensitized plate useful for preparing a lithographic printing plate of the present invention, any one of photosensitive layer comprising (A) diazo resin, (B) photo-polymerizable resin, or (C) photo-crosslinkable resin is preferably used. Hereinafter, the photosensitive layer of the present invention will be described.

(A) Photosensitive Layer Comprising Diazo Resin

As the negative-working photosensitive diazo compounds used in the photosensitive layer, a reaction product of diazonium salt and organic condensation reagent comprising reactive carbonyl such as aldol and acetal, e.g., a condensation product of diphenylamine-p-diazonium and formaldehyde (so called photosensitive diazo resin) described in U.S. Pat. Nos. 2,063,631 and 2,667,415 is suitably used. Also, useful other diazo compounds are described in J.P.KOKOKU Nos. 49-48001, 49-45322, and 49-45323. These diazo compounds are usually obtained in the form of water-soluble inorganic salt. Therefore, the compounds can be applied in the form of aqueous solution. In addition, these water-soluble diazo compounds can be further reacted with an aromatic or aliphatic compound having one or more of phenolic hydroxy group, sulfonic acid group or both hydroxy and sulfonic acid groups. Thus obtained photosensitive diazo resin that is substantially insoluble in water can be also used.

Further, it is possible to use a reaction product of diazonium compound with hexafluorophosphate of tetrafluoroborate as described in J.P. KOKAI No. 56-121031.

Examples of the reaction product comprising phenolic hydroxy group include hydroxybenzophenone, 4,4-bis (4'-hydroxyphenyl)pentanoic acid, resorcinol, or diphenolic acid such as diresorcinol, which may further comprise any substituent. Examples of hydroxybenzophenone include 2,4-dihydroxybenzophenone, 2-hydroxy-4-methoxybenzophenone, 2,2-dihydroxy-4,4-dimethoxybenzophenone or 2,2',4,4-tetrahydroxybenzophenone. aromatic compounds such as benzene, toluene, xylene, naphthalene, phenol, naphthol, benzophenone and the like, or soluble salts thereof,, ammonium salt and alkali metal salt. Compounds comprising sulfonic acid group may be substituted by lower alkyl group, nitro group, halo group and/or an additional sulfonic acid group. Preferred compounds include benzenesulfonic acid, toluenesulfonic acid, naphthalenesulfonic acid, 2,5-dimethylbenzenesulfonic acid, benzenesulfonic acid sodium salt, naphthalene-2-sulfonic acid, 1-naphthol-2(or 4)-sulfonic acid, 2,4-dinitro-1-naphthol-7-sulfonic acid, 2-hydroxy-4-methoxybenzophenone-5-sulfonic acid, m-(p -anilinophenylazo)benzenesulfonic acid, arizarin sulfonic acid, o-toluidine-m-sulfonic acid, ethanesulfonic acid and the like. Sulfonic acid ester of alcohol or salt thereof is also useful. Generally, such compounds are easily obtainable as an anionic surfactant. Examples of such compounds include ammonium salt or alkali metal salt of lauryl sulfate, alkylaryl sulfate, p-nonylphenyl sulfate, 2-phenylethyl sulfate and the like.

These substantially water-insoluble photosensitive diazo resins can be isolated as a precipitate by admixing water-soluble photosensitive diazo resin and aqueous solution of said aromatic or aliphatic compound, preferably in the ratio of equivalence.

In addition, diazo resin described in British Patent No. 1,312,925 is also preferred.

Moreover, the following diazo resins are also preferred: diazo resin comprising oxy acid of phosphor described in J.P. KOKAI No. 3-253857, diazo resin condensed with carboxyl group-containing aldehyde or acetal compound thereof described in J.P. KOKAI No. 4-18559, and copolymerized diazo resin with carboxy-containing aromatic compound such as phenoxyacetic acid described in J.P.A. No. 3-23031.

Most preferable diazo resin is dodecylbenzenesulfonate, a condensation product of p-diazodiphenylamine and formaldehyde.

The amount of the diazo resin usually ranges 5 to 50% by weight on the basis of the total weight of the photosensitive layer. When the amount of diazo resin is lesser, stability of the resin with time will be decreased although sensitivity of the photosensitive layer is consequently improved. Optimum amount of diazo resin is about from 8 to 20% by weight.

Although a variety of polymers can be used as a binder, a polymer comprising hydroxy, amino, carboxylic acid, amide, sulfonamide, active methylene, thioalcohol, epoxy or the like can be preferably used in the present invention. Examples of such preferable binder polymer include shellac as described in British Patent No. 1,350,521, a polymer comprising hydroxyethyl acrylate unit or hydroxyethyl methacrylate unit as a main repeat unit as described in British Patent No. 1,460,973 and U.S. Pat. No. 4,123,276, polyamide resin as described in U.S. Pat. No. 751,257, phenol resin and polyvinyl acetal resin such as polyvinyl formal resin and polyvinyl butyral resin as described in British Patent No. 1,074,392, linear polyurethane resin as described in U.S. Pat. No. 3,660,097, phthalate resin of polyvinyl alcohol, epoxy resin obtainable by condensation of bisphenol A and epichlorohydrin, polymer comprising amino group such as polyaminosulfone and polyalkylamino (meth)acrylate, cellulose derivatives such as cellulose acetate, cellulose alkyl ether, cellulose acetate phthalate and the like.

The composition comprising diazo resin and binder may further comprise addictives such as pH indicator (British Patent No. 1,041,463), phosphoric acid, dyes or the like (U.S. Pat. No. 3,236,646).

(B) Photosensitive Layer Comprising Photo-polymerizable Resin

Photo-polymerizable composition usable in the photosensitive layer may comprise at least one polymerizable compound containing at least one ethylenically unsaturated bond, at least one initiator of photopolymerization and at least one polymeric compound as essential components.

The photo-polymerizable compound containing an ethylenically unsaturated bond means a compound having at least one ethylenically unsaturated bond in its structure and being in the form of monomer, prepolymer (that is, dimer, trimer and other oligomer), mixture thereof or copolymer thereof. Examples of such compound include unsaturated carboxylic acid, salts thereof, ester of unsaturated carboxylic acid and aliphatic polyalcohol, amide of unsaturated carboxylic acid and aliphatic polyamine and the like.

Examples of the unsaturated carboxylic acid include acrylic acid, methacrylic acid, itaconic acid, crotonic acid, isocrotonic acid, maleic acid and the like.

Examples of the salt of unsaturated carboxylic acid include alkali metal salt such as sodium salt and potassium salt, of aforementioned acid.

Examples of the ester of aliphatic polyalcohol compound and unsaturated carboxylic acid include acrylate ester, e.g., ethylene glycol diacrylate, triethylene glycol diacrylate, 1,3-butanediol diacrylate, tetramethylene glycol diacrylate, propylene glycol diacrylate, trimethylolpropane triacrylate, trimethylolethane triacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol hexaacrylate, sorbitol triacrylate, sorbitol tetraacrylate, sorbitol pentaacrylate, sorbitol hexaacrylate, polyester acrylate oligomer and the like.

Examples of the methacrylic acid ester include tetramethylene glycol dimethacrylate, trimethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pentaerythritol trimethacrylate, dipentaerythritol dimethacrylate, sorbitol trimethacrylate, sorbitol tetramethacrylate, bis-[p-(3-methacryloxy-2- hydroxypropoxy)phenyl]dimethylmethane, bis[p-(methacryloxyethoxy)phenyl]dimethylmethane and the like.

Examples of the itaconate ester include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate. Examples of crotonic acid ester include ethylene glycol dicrotonate, tetramethylene glycol dicrotonate, pentaerythritol dicrotonate, sorbitol tetracrotonate. Examples of isocrotonic acid ester include ethylene glycol diisocrotonate, pentaerythritol diisocrotonate, sorbitol tetraisocrotonate and the like. Examples of maleate ester include ethylene glycol dimaleate, triethylene glycol dimaleate, pentaerythritol dimaleate, sorbitol tetramaleate and the like. Additionally, mixtures of the aforementioned esters may be also included.

Examples of the amide compounds of aliphatic polyamine and unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, xylylenebismethacrylamide and the like.

Other examples include vinyl urethane compounds comprising in its molecule two or more of polymerizable vinyl group, which can be prepared by addition of vinyl monomer comprising hydroxy group shown below to polyisocyanate compound comprising at least two isocyanate groups in its molecule, described in J.P.KOKOKU No. 48-41708.

$CH_2=C(A)COOCH_2CH(B)OH$ (wherein, each A and B represents hydrogen atom or methyl group.)

Examples of initiator for photopolymerization include vicinal polyketaldonyl compound disclosed in U.S. Pat. No. 2,367,660, α-carbonyl compounds disclosed in U.S. Pat. Nos. 2,367,661 and 2,367,670, acyloin ether disclosed in U.S. Pat. No. 2,448,828, aromatic acyloin compound which are substituted with hydrocarbon groups at α-position as disclosed in U.S. Pat. No. 2,722,512, polynuclear quinone compounds disclosed in U.S. Pat. Nos. 3,046,127 and 2,951,758, a combination of triarylimidazole dimer/p-aminophenylketone disclosed in U.S. Pat. No. 3,549,367, benzothiazoles disclosed in U.S. Pat. No. 3,870,524, benzothiazoles/trihalomethyl-s-triazines disclosed in U.S. Pat. No. 4,239,850, acridines and phenazines disclosed in U.S. Pat. No. 3,751,259, and oxadiazoles disclosed in U.S. Pat. No. 4,212,970. The amount of these compounds ranges from about 0.5% to about 15% by weight, preferably 2% to 10% by weight on the basis of the total weight of the photosensitive composition.

Examples of polymeric compounds usable in the present invention include copolymer of benzyl (meth)acrylate/(meth)acrylic acid/other optional addition-polymerizable vinyl monomer as disclosed in J.P.KOKOKU No. 59-44615; copolymer of methacrylic acid/methyl methacrylate or methacrylic acid/alkyl methacrylate as disclosed in J.P.KOKOKU No. 54-34327, (meth)acrylic acid copolymer as disclosed in J.P.KOKOKU No. 58-12577, J.P.KOKOKU No. 54-25957, and J.P. KOKAI No. 54-92723, copolymer of allyl (meth)acrylate/(meth)acrylic acid/other optional addition-polymerizable vinyl monomer as disclosed in J.P. KOKAI No. 59-53836, addition products of maleic anhydride copolymers and pentaerythritol triacrylates through half-esterification as disclosed in J.P. KOKAI No. 59-71048, and acidic vinyl polymer with acid value of 50 to 200 having —COOH, —PO$_3$H$_2$, —SO$_3$H, —SO$_2$NH$_2$, —SO$_2$NHCO— group in a polymer such as copolymer of vinyl methacrylate/methacrylic acid/other optional addition-polymerizable vinyl monomer.

Among said polymers, copolymers of benzyl (meth)acrylate/(meth)acrylic acid/other optional addition-polymerizable vinyl monomer and copolymers of allyl (meth)acrylate/(meth)acrylic acid/other optional addition-polymerizable vinyl monomer are preferable.

These polymeric compounds can be used alone or combination of two or more of compounds. Molecular weight of these polymeric compounds varies in a wide-range depending on the kind of compounds, but generally in the range of from 5,000 to 1,000,000, preferably from 10,000 to 500,000. The amount of polymeric compound ranges from 10% to 90% by weight, preferably from 30% to 85% by weight on the basis of total photo-polymerizable composition.

In addition to the above components, it is preferred that the photosensitive layer may further comprise an inhibitor for heat polymerization. For example, hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole and the like are useful. In addition, if necessary, a dye or a pigment for the purpose of dyeing the photosensitive layer or a pH indicator as a printing out agent may be added to the photosensitive layer. Further, a surfactant (e.g., fluoro surfactant as disclosed in J.P. KOKAI Nos. 62-170950 and 62-226 143, and U.S. Pat. No. 3,787,351), or alkyl ethers may be added to improve applicability of the composition.

Such (B) photo-polymerizable resin compounds may additionally comprise diazo resin described in (A) for the purpose of improving adhesion between the photosensitive layer and substrate.

Also, as a stabilizing agent for diazo resin, malic acid, phosphorous acid, tartaric acid, citric acid, phosphoric acid, dipicolinic acid, polynuclear aromatic sulfonic acid and salt thereof, sulfosalicylic acid and the like can be added, if necessary. In order to prevent an inhibition of polymerization due to oxygen in air, a wax can be added. Wax usable in the present invention is such that it presents as a solid form at ordinary temperature but dissolves in a coating solution and precipitates during coating and drying process. Examples of such wax include higher fatty acid such as stearic acid and behenic acid, higher fatty acid amide such as stearylamide and behenylamide, higher alcohol and the like.

In order to completely protect the photosensitive layer from inhibition of polymerization by oxygen in air, a protective layer comprising a polymer which is excellent in blocking oxygen such as polyvinyl alcohol, acidic celluloses and the like may be formed on the photosensitive layer. For example, a method for formation of such protective layer is described in U.S. Pat. No. 3,458,311, and J.P.KOKOKU No. 55-49729.

(C) Photosensitive Layer Comprising Photo-crosslinkable Resin

Photo-crosslinkable composition usable in the present invention comprises photo-crosslinkable polymer having at least one photo-dimerizable unsaturated bond and at least one sensitizer as essential components.

Examples of the photo-crosslinkable polymer comprising photo-dimerizable unsaturated bond usable for the composition in the present invention include photosensitive polymer comprising on the side chain or main chain a functional group such as maleimide group, cinnamyl group, cinnamoyl group, cinnamylidene group, cinnamylideneacetyl group and the like.

Especially a polymer comprising maleimide group on the side chain and polyester resin comprising cinnamic acid skeleton in the molecule show relatively high sensitivity.

Examples of such photo-dimerizable polymer comprising maleimide group on the side chain include the following polymers; a polymer represented by the following general formula (II) as disclosed in J.P. KOKAI No. 52-988 (corresponding to U.S. Pat. No. 4,079,041), German Patent No. 2,626,769, European Patent No. 21,019, European Patent No. 3,552 and Die Angewandte Makromolekulare Chemie, 115. (1983), pp.163-181:

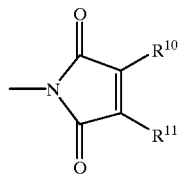
(II)

(wherein, $R^{10}$ and $R^{11}$ independently may represent alkyl group having at most 4 carbon atoms, or $R^{10}$ and $R^{11}$ may be linked together to form 5-membered or 6-membered carbocyclic ring); and a polymer comprising maleimide group on the side chain represented by the following formula (III) as disclosed in J.P. KOKAI Nos. 49-128991, 49-128992, 49-128993, 50-5376, 50-5377, 50-5379, 50-5378, 50-5380, 53-5298, 53-5299, 53-5300, 50-50107, 51-47940, 52-13907, 50-45076, 52-121700, 50-10884, and 50-45087, and German Patent Nos. 2,349,948 and 2,616,276:

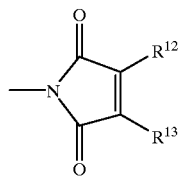
(III)

(wherein, $R^{12}$ represents aromatic group, and $R^{13}$ represents hydrogen atom, halogen atom, alkyl group or cyano group).

Average molecular weight of these polymers is 1,000 or above, preferably from 10,000 to 100,000. These polymers comprise two maleimide groups on the side chain in one molecule on the average. Among them, a polymer having acidic group is preferable because it could be developed with alkaline aqueous solution and thus, in the light of antipollution. The acid value of the polymer with maleimide group comprising an acidic group is preferably from 20 to 300, and more preferably from 50 to 200. Among these polymers having the acid value defined above, a copolymer of N-[2-(methacryloyloxy)ethly]-2,3-dimethylmaleimide with methacrylic acid or acrylic acid as described in Die Angewandte Makromolekulare Chemie, 128(1984), pp.71-91 is useful. In the preparation of the copolymer, a third component, vinyl monomer can be used for copolymerization to easily produce a multi-component copolymer depending on various purposes. For example, as the third component (vinyl monomer), homopolymer of alkyl methacrylate or alkyl acrylate having glass transition point of room temperature or below can be used to impart flexibility to the copolymer.

In addition, polymers comprising at least two groups represented by the following general formula (IV) or (V) may be used as the photo-crosslinkable polymer comprising photo-dimerizable unsaturated bond.

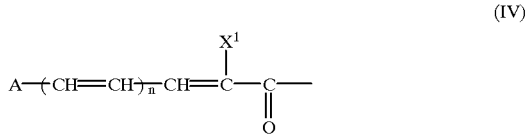
(IV)

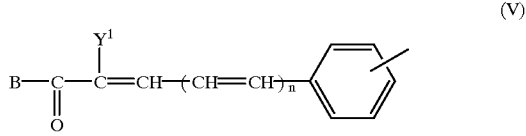
(V)

(wherein,
A; aryl, substituted aryl, furyl or thienyl group,
B; alkoxy, aryl, substituted aryl or alkyl group,
$X^1$; H, CN, halogen atom, phenyl or alkyl group,
$Y^1$; H, CN, halogen atom, phenyl or alkyl group,
n; an integer of 0 or 1.)

Examples of the polymer comprising at least two groups represented by the general formula (IV) or (V) on the side chain include acrylate ester, methacrylate ester or vinyl ether comprising the group of general formula (IV) or (V), a copolymer thereof and a copolymer further comprising other addition-polymerizable vinyl monomer. Examples of acrylate ester, methacrylate ester or vinyl ether compounds comprising group of general formula (IV) or (V) include those as described in British Patent No. 949,919, J.P.KOKOKU No. 45-36755, J.P.KOKOKU No. 46-4603, J.P. KOKAI No. 47-34794, J.P.KOKOKU No. 59-14352, J.P.KOKOKU No. 49-28122, J.P. KOKAI No. 49-36794, J.P. KOKAI No. 49-103975, J.P.KOKOKU No.50-11283, J.P.KOKOKU No. 50-24621, J.P.KOKOKU No. 51-481, J.P.KOKOKU No. 55-44930, J.P.KOKOKU No. 56-37244, J.P.KOKOKU No. 56-52923, J.P.KOKOKU No. 57-28488 and the like. Examples of preferable compounds include polyacrylate ester, polymethacrylate ester or polyvinyl ether compounds having cinnamate ester on the side chain. Molecular weight of these compounds ranges preferably from 2,000 to 1,000,000, and more preferably from 10,000 to 200,000.

In addition, the diazo resin described in (A) may be further added to the above-mentioned (C) photo-crosslinkable resin for the purpose of improving the adhesion between the substrate and photosensitive layer.

Moreover, as a stabilizing agent for such diazo resin, malic acid, phosphorous acid, tartaric acid, citric acid, phosphoric acid, dipicolinic acid, polynuclear aromatic sulfonic acid and salt thereof, sulfosalicylic acid and the like can be optionally added.

Other example of the photo-crosslinkable polymer comprising photo-dimerizable unsaturated double bond includes photosensitive polyester prepared by condensation of phenylenediacrylic acid or its alkyl ester with glycol, which shows high sensitivity.

Also, there have been many attempts to solubilize these polymers into alkaline aqueous solution. For example, J.P. KOKAI No. 60-191244 describes a photosensitive composition that is developable with alkaline water, comprising a photosensitive polymer having carboxyl group on the side chain. Further, a variety of methods to obtain such polymer have been reported; e.g. a method comprising reacting hydroxy group of polyvinyl alcohol with cinnamic acid chloride and acid anhydride to obtain a polymer having good solubility in alkaline water as well as good photosensitivity (U.S. Pat. No. 2,861,058), a method comprising reacting copolymer of maleic anhydride and styrene with β-hydroxyethyl cinnamate ester (U.S. Pat. No. 2,835,656), a method comprising incorporation of methacrylic acid into cinnamic acid acryl ester polymer (U.S. Pat. No. 3,357,831), a method comprising esterification of phenoxy resin with monoethyl ester of p-phenylenediacrylic acid followed by hydrolyzation of the product (U.S. Pat. No. 3,702,765), a method comprising addition of activated mercaptocarboxylic acid to a part of unsaturated double bond (J.P. KOKAI No. 63-2 18945).

The photosensitive polymer may be comprised in the photosensitive layer in an amount of about 20% to 99% by weight, preferably, 50% to 99% by weight.

As a sensitizer usable for the photo-crosslinkable composition of the present invention, a triplet sensitizer having maximum absorbance such that it allows actual sufficient light absorbance at 300 nm or higher is preferred. Examples of such sensitizer include benzophenone derivatives, benzanthrone derivatives, quinones, anthraquinones, aromatic nitro compounds, naphthothiazoline derivatives, benzothiazoline derivatives, xanthones, naphthothiazole derivatives, ketocoumarin compounds, benzothiazole derivatives, naphthofuranone compounds, benzoin compounds, acetophenone compounds, fluorenone compounds, pyrylium salt, thiapyrylium salt and the like. More specifically, examples of such compounds include Michler's ketone, N,N'-diethylaminobenzophenone, benzanthrone, (3-methyl-1,3-diaza-1,9-benz)anthrone picramide, 5-nitroacenaphthene, 2-nitrofluorene, 2-dibenzoylmethylene-3-methylnaphthothiazoline, 3,3-carbonyl-bis(7-diethylaminocoumarin), 2,4,6-triphenylthiapyrylium perchlorate, 2-(p-chlorobenzoyl)naphthothiazole, benzoin, benzoinmethyl ether, benzoinethyl ether, 2,2-dimethoxy-2-phenylacetophenone, 9-fluorenone, 2-chloro-9-fluorenone, 2-methyl-9-fluorenone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, dibenzalacetone, p-(dimethylamino)phenylstyrylketone, p-(dimethylamino)phenyl-p-methylstyrylketone and the like.

In addition, thioxanthone derivatives e.g., 2-chlorothioxanthone, 2-isopropylthioxanthone, dimethylthioxanthone, and substituted thioxanthones such as those described in German Patent Nos. 3018891 and 3117568, and European Patent No. 33720, British Patent No. 2075506 are preferably used.

Further, it is useful to utilize merocyanine pigment, e.g., 2-heterocyclecarbonylmethylene)benzo(or naphtho)thiazoline, 2-(diheterocyclecarbonylmethylene)benzo(or naphtho)thiazoline, 2-dibenzoylmethylenebenzo(or naphtho)thiazoline. More specifically, merocyanine pigment includes 2-[bis(2-furoyl)methylene]-3-methylbenzothiazoline, 2- [bis(2-thenoyl)methylene]-3-methylbenzo thiazoline, 2-[bis(2-furoyl)methylene]-3-methylnaphthothiazoline, 2-[bis(2-furoyl)methylene]-3-methylnaphthothiazoline, 2-(2-furoyl)methylene-3-methylbenzothiazoline, 2-benzoylmethylene-3-methylbenzothiazoline, 2-bis(benzoylmethylene)benzothiazoline, 2-bis(benzoylmethylene)naphthothiazoline as described in J.P.KOKOKU No. 52-129791, sensitizing dyes having thiobarbituric acid ring such as thiazoles, benzothiazoles, naphthothiazoles, and benzoselenazoles as described in J.P.KOKOKU No. 45-8832, sensitizers as disclosed in J.P.A. No. 1-190963.

Additionally, a binder or a plasticizer may be optionally added to the photo-crosslinkable composition. Examples of the binder include a copolymer of at least one monomer such as chlorinated polyethylene, chlorinated polypropylene, polyacrylic acid alkyl ester, acrylic acid alkyl ester, acrylonitrile, vinyl chloride, styrene, butadiene and the like, polyamide, methyl cellulose, polyvinyl formal, polyvinyl butyral, methacrylic acid copolymer, acrylic acid copolymer, and itaconic acid copolymer.

As the plasticizer, dialkyl ester of phthalic acid such as dibutyl phthalate and dihexyl phthalate, oligoethylene glycol alkyl ester and phosphoric acid ester can be used.

In addition, if necessary, a dye or a pigment for the purpose of dyeing the photosensitive layer, a pH indicator as a printing out agent or surfactant or alkyl ethers for the purpose of improving coating properties may be added to the photosensitive layer.

In addition, it is preferable to add an inhibitor for heat polymerization or an antioxidant to the photosensitive layer. Examples of such agent include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-t-butylphenol), 2-mercaptobenzoimidazole and the like.

Substrate and Treatment Thereof

The substrate usable for the present invention comprising a hydrophilic surface includes a variety of materials such as paper, plastic and metals. But when it is used for presensitized plate for a lithographic printing plate, an aluminum plate that is treated so that the surface of the plate becomes hydrophilic is especially preferable.

The surface of the aluminum plate is preferably treated as follows; at first, the surface can be grained by mechanical graining such as wire brush graining and nylon brush graining with slurry of abrasive particles, ball graining and the like, chemical graining using HF, $AlCl_3$ or HCl as an etchant, electrolytic graining using nitric acid or hydrochloric acid as electrolyte, or combination of these grainings, then the surface is optionally etched with acid or alkali, and anodized in sulfuric acid, phosphoric acid, oxalic acid, boric acid, chromic acid, sulfamic acid or mixture of these acids with direct or alternating current to give an anodized layer on the surface.

Such passivated layer makes the surface of aluminum hydrophilic. Moreover, it is especially preferable that the surface is optionally treated as follows to obtain hydrophilicity; treatment with silicate (sodium silicate, potassium silicate) as described in U.S. Pat. No. 2,714,066 and U.S. Pat. No. 3,181,416, dtreatment with potassium fluorozirconate as described in U.S. Pat. No. 2,946,638, treatment with phosphomolybdate as described in U.S. Pat. No. 3,201,247, treatment with alkyl titanate as described in British Patent No. 1,108,559, treatment with polyacrylic acid as described in German Patent No. 1,091,433, treatment with polyvinyl phosphonic acid as described in German Patent No. 1,134,093 or British Patent No. 1,230,447, treatment with phosphonic acid as described in J.P.KOKOKU No. 44-6409, treatment with phytic acid as described in U.S. Pat. No. 3,307,951, treatment with a salt of hydrophilic organic polymer and bivalent metal as described in J.P. KOKAI No. 58-16893 or J.P. KOKAI No. 58-18291, undercoating with water-soluble polymer comprising sulfonic acid group as described in J. P. KOKAI No. 59-101651. Other treatment to give the substrate hydrophilicity such as electrodeposition with silicate as described in U.S. Pat. No. 3,658,662 can be also used.

In addition, it is also preferable to fill the pores on the substrate after graining and anodizing. Such treatment can be conducted by immersing the plate into hot water, hot aqueous solution comprising inorganic salt or organic salt, or steam bath.

Exposure and Development

The photosensitive composition applied on the substrate of the present invention is imagewise exposed to light through an original transparency with line image or dot image, and then developed with an aqueous alkaline developer to provide negative-working relief of the original transparency. Examples of light source suitable for exposure include carbon arc light, mercury vapor lamp, xenon lamp, metal halide lamp, strobe, ultraviolet rays, laser beam and the like.

Any developer known in the art can be used to develop the presensitized plate of the present invention. But the developers described hereinafter are preferable. For example, the developer preferably comprises at least one alkaline agent and water as essential components.

Examples of the alkaline agent comprised in the developer as essential component include inorganic alkaline agent such as sodium silicate, potassium silicate, potassium hydroxide, sodium hydroxide, lithium hydroxide, dibasic or tribasic sodium or ammonium phosphate, sodium metasilicate, sodium carbonate, ammonia and the like, and organic amine compounds such as mono, di, or trimethylamine, mono, di or triethylamine, mono or diisopropylamine, n-butylamine, mono, di or triethanolamine, mono, di or triisopropanolamine, ethyleneimine, ethylenediimine and the like.

The amount of alkaline agent in the developer may be in the range of 0.05% to 10% by weight and preferably 0.5% to 5% by weight. When the amount of the alkaline agent is less than 0.05% by weight, development is defective and when the amount is above 10% by weight, the developer give ill effect on printing performance of printing plate.

The developer for the presensitized plate useful for preparing a lithographic printing plate of the present invention may comprise certain organic solvents, if necessary.

The organic solvent described herein means that capable of dissolving or swelling non-exposed area (non-imaging area) of the photosensitive layer when the plate is immersed in the developer and that having solubility of 10% by weight or below to water at ordinary temperature (20° C.). Any organic solvent having such properties could be used for the developer of the present invention. Examples of such solvent is described below, but not limited thereto; ester of carboxylic acid such as ethyl acetate, propyl acetate, butyl acetate, amyl acetate, benzyl acetate, ethylene glycol monobutyl acetate, butyl lactate, butyl levulinate; ketones such as ethyl butyl ketone, methyl isobutyl ketone, cyclohexanone and the like; alcohols such as ethylene glycol monobutyl ether, ethylene glycol benzyl ether, ethylene glycol monophenyl ether, benzyl alcohol, methyl phenyl carbinol, n-amyl alcohol, methylamyl alcohol; alkyl-substituted aromatic hydrocarbon such as xylene; halogenized hydrocarbon such as methylene dichloride, ethylene dichloride, and monochlorobenzene. These organic solvents may be used alone or in combination of two or more solvents. Among these solvents, ethylene glycol monophenyl ether and benzyl alcohol are especially useful. The amount of these solvents in the developer ranges approximately from 0 to 20% by weight. Especially, use of the solvent in an amount of 2 to 10% by weight gives desirable result.

In addition, the developer usable for the presensitized plate of the present invention may optionally comprise aqueous sulfite salt. Preferred sulfite salt includes alkali or alkali earth metal of sulfurous acid such as sodium sulfite, potassium sulfite, lithium sulfite, magnesium sulfite and the like. The amount of the sulfite compound in the developer composition ranges from 0 to 4% by weight and preferably from 0.1 to 1% by weight.

In addition, in place of the above-mentioned aqueous sulfite salt, hydroxy aromatic compounds such as alkaline-soluble pyrazolone compound, alkaline-soluble thiol compound, and methylresorcin may be added. Also, these compounds can be used together with aqueous sulfite salt.

Also, a certain solubilizer to aid dissolution of the aforementioned organic solvent to water may be added. As the solubilizer, it is preferred to use alcohols or ketones which have lower molecular weight and higher water-solubility than that of the organic solvent to be used, to obtain the effect of the present invention, Also, anionic surfactant, amphoteric surfactant and the like can be used. Preferred examples of such alcohols and ketones include methanol, ethanol, propanol, butanol, acetone, methyl ethyl ketone, ethylene glycol monomethyl ether, ethylene glycol monoethyl ether, methoxybutanol, ethoxybutanol, 4-methoxy-4-methylbutanol, N-methylpyrrolidone and the like. Preferred examples of surfactant include sodium isopropylnaphthalenesulfonate, sodium n-butylnaphthalenesulfonate, sodium N-methyl-N-pentadecylaminoacetate, sodium lauryl sulfate and the like. Generally, the amount of solubilizer such as alcohols and ketones is preferably about 30% by weight or less on the basis of the total amount of the developer.

However, the developer comprising any organic solvent may cause many problems (e.g., problems on health such as toxicity and odor during work, safety such as fire and gaseous explosion, workability such as generation of foam, pollution by wastewater, cost and the like). Therefore, it is preferable that the developer does not substantially comprise organic solvent.

The phrase "does not substantially comprise organic solvent" means that the amount of organic solvent does not exceed the amount that cause aforementioned disadvantages in environmental health, safety and workability. In the present invention, the amount of organic solvent in the composition is 2% by weight or less and preferably 1% by weight or less.

For example, a developer composition described as a developer for positive-working presensitized plate in J.P. KOKAI No. 59-84241 and J.P. KOKAI No. 57-192952 can be used as such aqueous alkaline developer substantially comprising no organic solvent.

The presensitized plate of the present invention may be used to make a lithographic printing plate by the method as described in J.P. KOKAI Nos. 54-8002 and 55-115045, J.P. KOKAI No. 59-58431. That is, after development, the plate can be washed with water and then treated to desensitize the plate to grease, directly treated to desensitize the plate to grease, treated with water comprising acid, or treated to desensitize the plate to grease after the treatment with water comprising acid. In addition, if developability of the developer is lowered because of decrease of the alkaline concentration due to consumption of alkaline aqueous solution in an amount used for development or contamination of air after running automatic developing machine for long time, the developability of the developer can be recovered using replenisher or replenishing method as described in J.P. KOKAI Nos. 54-62004, 55-22759, 55-115039, 56-12645, 58-95349, and 64-21451, and J.P. KOKAI Nos. 1-180548, and 2-3065.

In addition, photomechanical process is preferably conducted using automatic developing machine as described in J.P. KOKAI Nos. 2-7054 and 2-32357. Furthermore, a gum for providing the plate an insensitivity to oil can be optionally applied in the final step of the photomechanical process and preferred examples of such gum include those as described in J.P.KOKOKU Nos. 62-16834, 62-25118, and 63-52600, and J.P. KOKAI Nos. 62-7595, 62-11693, and 62-83194.

EXAMPLES (A) Preparation Method for Urethane Resin

In a 500 ml volume of three-neck round bottom flask equipped with a condenser and an agitator, 2,2-bis (hydroxymethyl)propionic acid (11.5 g, 86 mmol), diethylene glycol ether (7.26 g, 68.4 mmol) and 1,4-butanediol (4.11 g, 45.6 mmol) were dissolved in 118 g of N,N-dimethylacetamide. To the mixture, 4,4'-diphenylmethane diisocyanate (30.8 g, 123 mmol), hexamethylene diisocyanate (13.8 g, 81.9 mmol) and di-n-butyltin dilaurate (0.1 g) as a catalyst were added. The mixture was heated at 90° C. for 7 hours under stirring. To the reaction mixture, 100 ml of N,N-dimethylacetamide, 50 ml of methanol and 50 ml of acetic acid were added. After being stirred, the mixture was poured into 4 liter of water under stirring to precipitate white polymer. The polymer was filtered, washed with water and dried in vacuo to give 62 g of urethane resin.

(B) Preparation of Substrate

The surface of aluminum sheet, JIS1050 was grained with rotary nylon brush using a suspension of pumice stone in water as an abrasive. Roughness of the surface (Ra) was 0.5 $\mu$m. After being washed with water, the sheet was immersed in an aqueous solution of 10% sodium hydroxide at 70°C. to etch the sheet until the amount of dissolution of aluminum became 6g/m$^2$. After being washed with water, it was then immersed in 30% aqueous solution of nitric acid for 1 minute to neutralize and fully washed with water. Next, electrolytic graining of the sheet was conducted in 0.7% aqueous solution of nitric acid using rectangle alternating continuous wave voltage with 13 volts of anode voltage and 6 volts of cathode voltage for 20 seconds. It was then immersed in 20% nitric acid at 50°C. to wash its surface followed by washing with water. Further, the sheet was anodized in 20% aqueous solution of nitric acid using direct current to form a porous layer. Electrolysis of the sheet was conducted using 5A/dm$^2$ of current density for suitably controlled time to obtain a substrate having 2.5g/m$^2$ of anodized layer. This substrate was treated with 2.5% of sodium silicate solution at 70°C. for 12 seconds, washed completely with water and dried.

Example 1

On the substrate prepared as described in (B), "Coating composition (1) for intermediate layer" was applied by rotary applicator in an amount of 10 mg/m$^2$ as dry weight and dried at 80° C. for 1 minute.

Formulation of "Coating Solution (1) for Intermediate Layer"

| | |
|---|---|
| 4-Diazodiphenylamine hydrogen sulfate | 1 g |
| Phosphoric acid | 0.1 g |
| Ion exchanged water | 1000 g |
| Methanol | 1000 g |

Then, "Coating solution (1) for photosensitive layer" was applied on the intermediate layer on the substrate in an amount of 2.0 g/m$^2$ as dry weight by rotary applicator and dried at 100° C. for 1 minute.

Formulation of "Coating Solution (1) for Photosensitive Layer"

| | |
|---|---|
| Urethane resin described in (A) | 5.0 g |
| Salt of condensation product of 4-diazodiphenylamine and formaldehyde with dodecylbenzenesulfonic acid | 1.2 g |
| Propane-1,2,3-tricarboxylic acid | 0.05 g |
| Phosphoric acid | 0.05 g |
| 4-Sulfophthalic acid | 0.05 g |
| Tricresyl phosphate | 0.25 g |
| Half ester of styrene-maleic anhydride copolymer with n-hexanol | 0.1 g |
| Victoria Pure Blue BOH | 0.18 g |
| Megafac F-177 (Dainippon Ink and Chemicals, Inc.) | 0.015 g |
| 1-Methoxy-2-propanol | 20.0 g |
| Methanol | 40.0 g |
| Methyl ethyl ketone | 40.0 g |
| Ion exchanged water | 1.0 g |

Thus obtained plate was placed in a room with the temperature of 45° C. and humidity of 75% for 8 hours. This test was conducted assuming that the plate was kept under severe environment. The presensitized plate was imagewise exposed by PS light (Fuji Photofilm) at a distance of 1 m from the plate for 1 minute, with a negative image film closely contacted to the plate. Then, the plate was treated with "Developer (1)" and "Coating solution (1) for desensitizing to grease" using an automatic developing machine (PS800H, Fuji Photofilm) to obtain a printing plate.

Formulation of "Developer (1)"

| | |
|---|---|
| Sodium sulfite | 5 g |
| Benzyl alcohol | 30 g |
| Triethanolamine | 5 g |
| Isopropylnaphthalenesulfonic acid, sodium salt | 12 g |
| Ion exchanged water | 1000 g |

Formulation of "Coating Solution (1) for Desensitizing to Grease"

| | |
|---|---|
| Gum arabic | 5 g |
| White dextrin | 30 g |
| Ethylene glycol | 10 g |
| Phosphoric acid | 3 g |
| Ion exchanged water | 1000 g |

Then the plate was printed using SOR-M printer (Heidelberg) and commercially available ink on quality papers to give 5000 prints without any problem.

Example 2

On the substrate prepared as described in (B), "Coating solution (2) for intermediate layer" was applied by rotary applicator in an amount of 10 mg/m² as dry weight and dried at 80° C. for 1 minute.

Formulation of "Coating Solution (2) for Intermediate Layer"

| 3-Methoxy-4-diazodiphenylamine, PF₆ salt | 1 g |
|---|---|
| Phosphoric acid | 0.1 g |
| Methanol | 2000 g |

Then, "Coating solution (1) for photosensitive layer" was applied on the intermediate layer on the substrate and dried as described in Example 1. Then the plate was kept under high temperature and high humidity, imagewise exposed, developed and printed as described in Example 1 to give good 5000 prints as in Example 1.

Example 3

On the substrate prepared as described in (B), "Coating solution (1) for intermediate layer" was applied by rotary applicator in an amount of 10 mg/m² as dry weight and dried at 80° C. for 1 minute. Then, "Coating solution (2) for photosensitive layer" was applied on the intermediate layer on the substrate in an amount of 2.0 g/m² as dry weight by rotary applicator and dried at 100° C. for 1 minute.

Formulation of "Coating Solution (2) for Photosensitive Layer

| Poly(allyl methacrylate/methacrylic acid) copolymer (molar ratio 70/30) | 5.0 g |
|---|---|
| Pentaerythritol tetraacrylate | 1.5 g |
| Initiator of photopolymerization described below | 0.3 g |
| PF₆ salt of condensation product of 4-diazodiphenylamine and formaldehyde | 0.2 g |
| Oil Blue #603 (Orient Chemical Industries, Co. Ltd.) | 0.15 g |
| Megafac F-177 (Dainippon Ink and Chemicals, Inc.) | 0.05 g |
| Phosphoroud acid (50%) | 0.05 g |
| Behenic acid amide | 0.1 g |
| Ethylene glycol monomethyl ether | 50.0 g |
| Methyl ethyl ketone | 50.0 g |
| Methanol | 20.0 g |

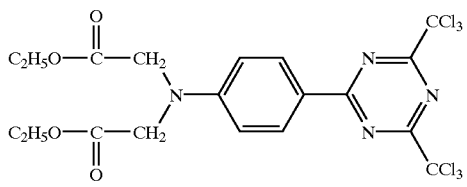

Then the plate was kept under high temperature and high humidity, imagewise exposed, developed and printed as described in Example 1 to give good 5000 prints as in Example 1.

Example 4

On the substrate prepared as described in (B), "Coating solution (1) for intermediate layer" was applied by rotary applicator in an amount of 10 mg/m² as dry weight and dried at 80° C. for 1 minute. Then, "Coating solution (3) for photosensitive layer" was applied on the intermediate layer on the substrate in an amount of 2.0 g/m² as dry weight by rotary applicator and dried at 100° C. for 1 minute.

Formulation of "Coating Solution (3) for Photosensitive Layer"

| Coplymer of methyl methacrylate/N-[6-(methacryloyloxy)hexyl]-2,3-dimethylmaleimide/methacrylic acid (= 10/60/30 molar ratio) | 5.0 g |
|---|---|
| Sensitizer comprising the chemical formula shown below | 0.3 g |
| Oil Blue #603(Orient Chemical Industries Co.Ltd.) | 0.1 g |
| PF₆ salt of co-condensation product of 3-methoxy-4-diazodiphenyl amine/phenoxy acetic acid (= 1/1 molar ratio) and formaldehyde | 0.1 g |
| Megafac F-177 (Dainippon Ink and Chemicals, Inc.) | 0.1 g |
| Ethylene glycol monomethyl ether | 50.0 g |
| Methyl ethyl ketone | 50.0 g |
| Methanol | 20.0 g |

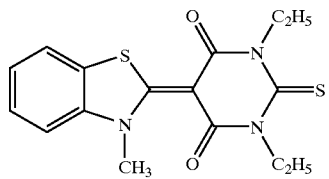

Thus obtained plate was placed in a room with the temperature of 45° C. and humidity of 75% for 8 hours. This test assumes that the plate was kept under bad environment. The presensitized plate was imagewise exposed by PS light (Fuji Photofilm) at a distance of 1 m from the plate for 1 minute, with a negative image film closely contacted to the plate. Then, the plate was treated with "Developer (2)" and "Coating solution (1) for desensitizing to grease described above using an automatic developing machine (PS800H, Fuji Photofilm) to obtain a printing plate.

Formulation of "Developer (2)"

| Potassium silicate (SiO₂/K₂O = molar ratio of about 1.1) | 20 g |
|---|---|
| Ion exchanged water | 1000 g |

Then the plate was kept under high temperature and high humidity, imagewise exposed, developed and printed as described in Example 1 to give good 5000 prints as in Example 1.

Comparative Example 1

An aluminum substrate was prepared as described in Example 1. Then "Coating solution (1) for photosensitive layer" described in Example 1 was applied on the substrate in an amount of 2.0 g/m² as dry weight to prepare a presensitized plate. This plate was prepared without forming any intermediate layer. Thus obtained plate was kept in a room at the temperature of 45° C. and humidity of 75% for 8 hours. This test was conducted assuming that the plate was kept under severe environment. The presensitized plate was imagewise exposed by PS light (Fuji Photofilm) at a distance of 1 m from the plate for 1 minute, with negative image film closely contacted to the plate. Then, the plate was treated with "Developer (1)" and "Coating solution (1) for desensitizing to grease" described above using an automatic developing machine (PS800H, Fuji Photofilm). As a result, dot which should remain as an image was detached due to insufficient adhesion between the substrate and the photosensitive layer.

Comparative Example 2

On the substrate prepared as described in (B), "Coating solution (3) for intermediate layer" was applied by rotary applicator in an amount of 10 g/m² as dry weight and dried at 80° C. for 1 minute. Then "Coating solution (1) for photosensitive layer" was applied on the diazo resin on the substrate by rotary applicator in an amount of 2.0 g/m² as dry weight and dried at 100° C. for 1 minute.

The average molecular weight of condensation product of p-diazophenylamine and formaldehyde hydrogen sulfate determined by gel permeation chromatography was 2060 based on polystyrene standard.

Formulation of "Coating Solution (3) for Intermediate Layer"

| | |
|---|---|
| Condensation product of p-diazodiphenylamine and formaldehyde, hydrogen sulfate salt | 1 g |
| Phosphoric acid | 0.1 g |
| Ion exchanged water | 1000 g |
| Methanol | 1000 g |

Then the plate was kept under high temperature and high humidity, imagewise exposed, developed and printed as described in Example 1. However, ink was adhered to non-imaging area of the plate to give so-called background contamination in printing.

Effect of the Invention

The negative-working presensitized plate useful for preparing a lithographic printing plate of the present invention having an intermediate layer comprising diazonium compound formed between aluminum substrate and photosensitive layer shows excellent adhesiveness between aluminum substrate and photosensitive layer and does not cause adhesion of dirt in non-imaging area, without decrease of high sensitivity, sensitive range and performance of the photosensitive layer.

What is claimed is:

1. A negative-working presensitized plate useful for preparing a lithographic printing plate having a negative-working photosensitive layer on an aluminum substrate, which comprises an intermediate layer comprising a compound having one diazonium group and a molecular weight of 1000 or less formed between said photosensitive layer and said aluminum substrate.

2. The negative-working presensitized plate according to claim 1, wherein the compound having one diazonium group is represented by the following general formula (I);

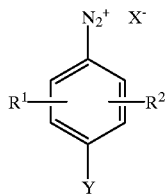

(I)

wherein, $R^1$ and $R^2$, which may be the same or different, are hydrogen atom, $C_{1-10}$ alkyl, $C_{1-10}$ alkoxy or halogen atom;

Y represents —$NR^3R^4$ or —$SR^5$, wherein $R^3$ and $R^4$, which may be the same or different, are hydrogen atom, hydroxy, $C_{1-10}$alkyl, aryl or 5- or 6-membered aliphatic or aromatic heterocyclic ring, or alternatively, nitrogen atom, $R^3$ and $R^4$ may be linked together to form a 5- or 6-membered aliphatic or aromatic heterocyclic ring, wherein said $C_{1-10}$alkyl, aryl and 5- or 6-membered aliphatic or aromatic heterocyclic ring may have at least one substituent selected from the group consisting of hydroxy, $C_{1-10}$alkyl, $C_{1-10}$alkoxy, $C_{1-10}$alkylcarbonyl, aryl, aryloxy, arylcarbonyl, and 5- or 6-membered aliphatic or aromatic heterocyclic ring; or $R^3$ and $R^4$ may represent —$R^6G$, wherein, $R^6$ represents $C_{1-10}$alkylene, arylene, or bivalent group comprising $C_{1-10}$alkylene bonded to arylene and G represents at least one of —OR, —CO—R, —CO—NRR', —NRR', and —NR—CO—R', wherein, R and R' may be the same or different and are hydrogen atom, hydroxy (except when G is —OR), $C_{1-10}$alkyl, $C_{1-10}$alkoxy, aryl, aryloxy (except when G is —OR), or 5- or 6-membered aliphatic or aromatic heterocyclic ring, wherein each of R and R' may have at least one substitutent selected from the group consisting of hydroxy, $C_{1-10}$alkyl, $C_{1-10}$alkoxy, aryl, aryloxy, and 5- or 6-membered aliphatic or aromatic heterocyclic ring, respectively; and $R^5$ represents hydrogen atom, alkyl, alkoxyalkyl, arylalkyl, aryl, alkylaryl, or alkoxyaryl; and $X^-$ represents $HSO_4^-$, $½SO_4^{2-}$, $BF_4^-$, $PF_6^-$, or anion of triisopropyl-naphthalenesulfonic acid, 5-nitro-ortho-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol-5-sulfonic acid, 2-methoxy-4-hydroxy-5-benzoyl-benzenesulfonic acid, paratoluenesulfonic acid, or zinc chloride double salt.

3. The negative-working presensitized plate according to claim 2, wherein, $R^1$ and $R^2$, which may be the same or different, are hydrogen atom, methyl, ethyl, propyl, butyl, methoxy, ethoxy, i-propyloxy, n-propyloxy, n-butyloxy, i-butyloxy, t-butyloxy, Cl, F, Br, or I;

$R^3$ and $R^4$, which may be the same or different, are hydrogen atom, methyl, ethyl, propyl, butyl, hydroxymethyl, hydroxyethyl, hydroxypropyl, phenyl, benzyl, pyrrolidino, morpholino, or pyridyl group;

when —$NR^3R^4$ represents 5- or 6-membered aliphatic or aromatic heterocyclic ring, heterocyclic ring is substituted or unsubstituted pyrrolidino, morpholino, or pyridyl group; and $R^5$ represents hydrogen atom, methyl, ethyl, propyl, butyl, methoxymethyl, ethoxymethyl, phenyl, benzyl, or p-tolyl group.

4. The negative-working presensitized plate according to claim 2, wherein the cation of diazonium compound (I) is selected from the group consisting of cations of the following compounds: 4-diazodiphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N-N-dimethylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazo-dimethylaniline, 1-diazo-2,5-dibutyloxy-4-morpholinobenzene, 1-diazo-2,5-diethoxy-4-morpholinobenzene, 1-diazo-2,5-dimethoxy-4- morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propyloxy)-4-diazodiphenylamine, and 3-isopropyloxy-4-diazodiphenylamine.

5. The negative-working presensitized plate according to claim 1, wherein the intermediate layer comprises the diazonium compound in an amount ranging from 30 to 100% by weight on the basis of the total weight of the intermediate layer.

6. The negative-working presensitized plate according to claim 5, wherein the amount of the diazonium compound ranges from 50 to 100% by weight.

7. The negative-working presensitized plate according to claim 6, wherein the amount of the diazonium compound ranges from 70 to 100% by weight.

8. The negative-working presensitized plate according to claim 1, wherein the negative-working photosensitive layer is selected from the group consisting of photosensitive layer comprising diazo resin, photosensitive layer comprising photo-polymerizable resin, and photosensitive layer comprising photo-crosslinkable resin.

* * * * *